(12) United States Patent
Tashiro et al.

(10) Patent No.: US 8,872,239 B2
(45) Date of Patent: Oct. 28, 2014

(54) IMAGE PICKUP DEVICE

(71) Applicant: Canon Kabushiki Kaisha, Tokyo (JP)

(72) Inventors: Kazuaki Tashiro, Ebina (JP); Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/725,336

(22) Filed: Dec. 21, 2012

(65) Prior Publication Data

US 2013/0161701 A1    Jun. 27, 2013

(30) Foreign Application Priority Data

Dec. 27, 2011   (WO) ................. PCT/JP2011/080252

(51) Int. Cl.
*H01L 29/66* (2006.01)
*H01L 31/02* (2006.01)
*H01L 27/146* (2006.01)

(52) U.S. Cl.
CPC ............ *H01L 31/02* (2013.01); *H01L 27/1463* (2013.01); *H01L 27/14603* (2013.01); *H01L 27/14616* (2013.01)
USPC .... 257/239; 257/261; 257/314; 257/E29.129; 257/E21.179

(58) Field of Classification Search
USPC ........... 257/239, 261, 314, E29.129, E21.179
See application file for complete search history.

(56) References Cited

U.S. PATENT DOCUMENTS

2011/0073923 A1*   3/2011   Tatani et al. .................. 257/291

FOREIGN PATENT DOCUMENTS

| JP | 2000-150848 A | 5/2000 |
|----|---------------|--------|
| JP | 2000-286443 A | 10/2000 |
| JP | 2001-298177 A | 10/2001 |
| JP | 2006-041189 A | 2/2006 |
| JP | 2006-073609 A | 3/2006 |
| JP | 2007-081083 A | 3/2007 |
| JP | 2011-171511 A | 9/2011 |

\* cited by examiner

*Primary Examiner* — Timor Karimy
(74) *Attorney, Agent, or Firm* — Canon USA Inc IP Division

(57) ABSTRACT

An image pickup device according to the present invention is an image pickup device in which a plurality of pixel are arranged in a semiconductor substrate. Each of the plurality of pixels includes a photoelectric conversion element, a floating diffusion (FD) region, a transfer gate that transfers charges in the first semiconductor region to the FD region, and an amplification transistor whose gate is electrically connected to the FD region. The photoelectric conversion element has an outer edge which has a recessed portion in plan view, a source region and a drain region of the amplification transistor are located in the recessed portion, and the FD region is surrounded by the photoelectric conversion region or is located in the recessed portion in plan view.

10 Claims, 8 Drawing Sheets

IMAGE PICKUP DEVICE

TECHNICAL FIELD

The present invention relates to image pickup devices used in scanners, video cameras, digital still cameras, or the like. Particularly, the present invention relates to a pixel structure of an image pickup device.

BACKGROUND ART

Image pickup devices including pixels that are arranged one-dimensionally or two-dimensionally, each pixel including a light receiving region provided with a photoelectric conversion element, are mounted in digital cameras, video cameras, copying machines, facsimiles, or the like. Examples of image pickup devices include CCD image pickup devices and pixel-amplification-type image pickup devices.

As examples of a pixel-amplification-type image pickup element, PTL 1 discloses two examples of a configuration of a line sensor. The first example shows a configuration in which a modulation transistor is disposed at the center of a photoelectric conversion element. The modulation transistor is configured to store, in its channel portion, carriers having a conductivity type opposite to the polarity of the modulation transistor, amplify a signal in accordance with the amount of stored charges, and output the signal.

The second example shows a configuration in which a floating diffusion (hereinafter FD) region is located at the center of a photoelectric conversion element, and a ring-shaped gate electrode is disposed to surround the FD. The FD is connected to a gate of an amplification transistor via a wiring line, so as to constitute a charge-voltage converting unit.

CITATION LIST

Patent Literature

PTL 1 Japanese Patent Laid-Open No. 2007-081083

In the first example of PTL 1, it is difficult to increase the storage capacity of a carrier storage region under the channel of the modulation transistor while satisfying the characteristic of the modulation transistor.

In the second example of PTL 1, the specific disposition of the amplification transistor is not described. Depending on the disposition relationship between the amplification transistor and the FD, the wiring line which connects the FD and the gate electrode of the amplification transistor is long, thereby increasing wiring capacitance. The wiring capacitance is added to FD capacitance. If the FD capacitance increases, the charge-voltage conversion gain decreases and noise increases. This problem becomes further significant if the area of the photoelectric conversion element increases.

The present invention has been made in view of the problem, and provides an image pickup device which suppresses an increase in FD capacitance.

SUMMARY OF INVENTION

An embodiment of the present invention provides an image pickup device in which a plurality of pixels are arranged in a semiconductor substrate, each of the plurality of pixels including a photoelectric conversion element including a first semiconductor region of a first conductivity type and a second semiconductor region of a second conductivity type, the second semiconductor region constituting a PN junction together with the first semiconductor region; a floating diffusion region of the first conductivity type; a transfer gate that transfers charges in the first semiconductor region to the floating diffusion region; and an amplification transistor whose gate is electrically connected to the floating diffusion region. The first semiconductor region has an outer edge which has a recessed portion in plan view, a source region and a drain region of the amplification transistor are located in the recessed portion, and the floating diffusion region is surrounded by the first semiconductor region or is located in the recessed portion in plan view.

Further features of the present invention will become apparent from the following description of exemplary embodiments with reference to the attached drawings.

DESCRIPTION OF EMBODIMENTS

Figure 1:
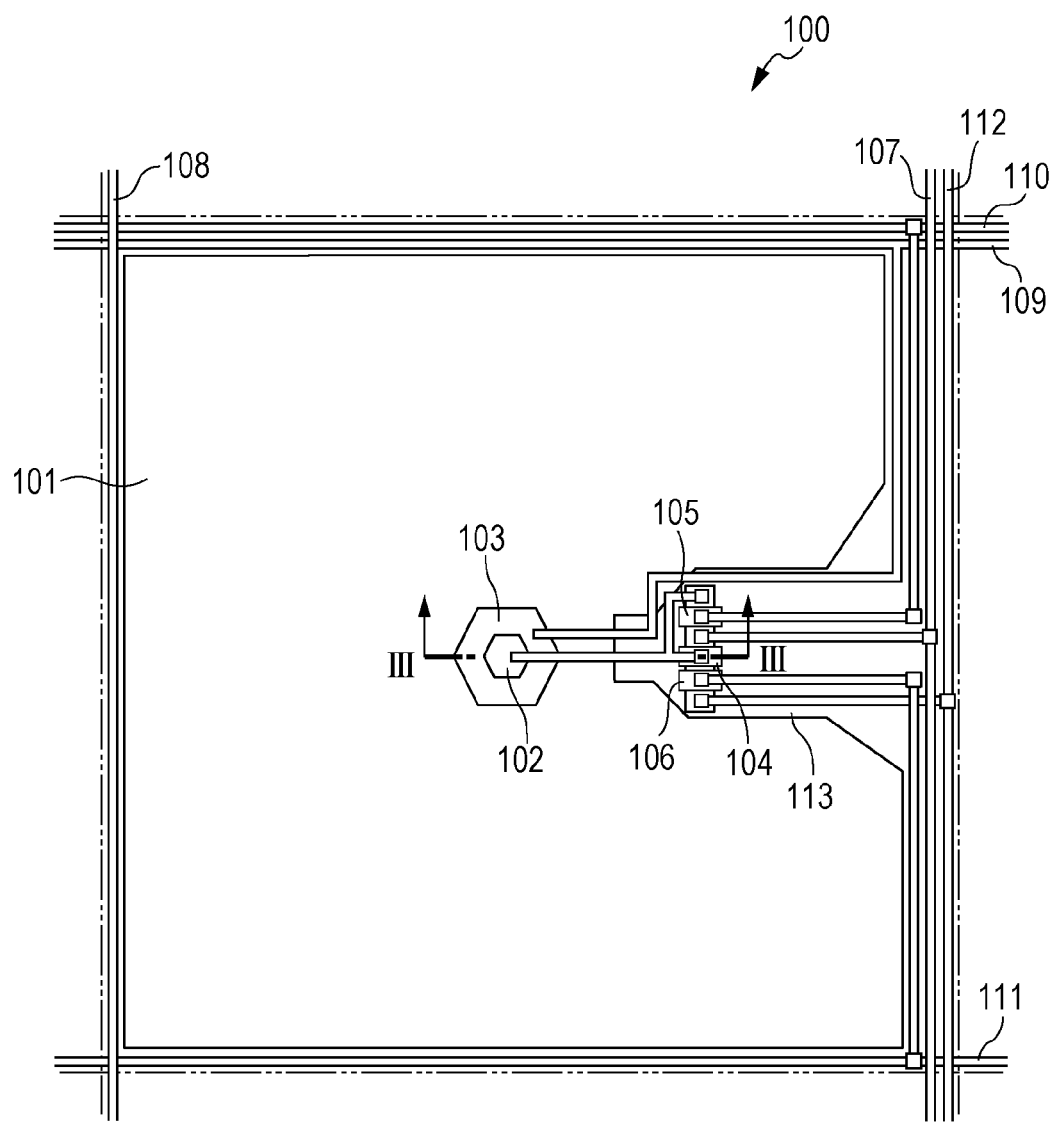
FIG. 1 is a diagram illustrating a pixel structure of an image pickup device according to a first embodiment.

An image pickup device according to an embodiment of the present invention includes a plurality of pixels each having a photoelectric conversion element, a FD region, a transfer gate that transfers charges of the photoelectric conversion element to the FD region, and an amplification transistor of a first conductivity type whose gate is electrically connected to the FD region via a conductor. The photoelectric conversion element includes a first semiconductor region of the first conductivity type (for example, N-type) and a second semiconductor region of a second conductivity type (for example, P-type), which is opposite to the conductivity type of the first semiconductor region. The first semiconductor region and the second semiconductor region constitute a PN junction. Each of the first semiconductor region and the second semiconductor region may be constituted by a plurality of semiconductor regions. The first semiconductor region has a lower potential with respect to signal charges. That is, the first semiconductor region is capable of storing signal charges. The outer edge of the first semiconductor region has a recessed portion in plan view, and the gate of the amplification transistor is disposed in the recessed portion. The FD region is surrounded by the first semiconductor region or is located in the recessed portion. Such a configuration will be described in first and second embodiments. The recessed portion may have a certain depth, and the most part thereof is constituted by a semiconductor region of the second conductivity type. A portion at the certain depth or more may be a semiconductor region of the first conductivity type. An element isolation region composed of an insulator may be located at a boundary portion of the first semiconductor region of the recessed portion. In a case where a transistor of a pixel is of the second conductivity type, the most part of the recessed portion may be a semiconductor region of the first conductivity type. In this description, a "FD region" or "FD" means a semiconductor region itself located in a semiconductor substrate.

Alternatively, as another example, the FD and the gate of the amplification transistor are surrounded by the first semiconductor region. Such a configuration will be described in third and fourth embodiments.

Conventionally, the amplification transistor is disposed on the outer side of the first semiconductor region of the first conductivity type constituting a photoelectric conversion element. Compared to this configuration, the point common to all the foregoing configurations is that the amplification transistor is disposed on the inner side of the first semiconductor region, thereby decreasing the distance between the FD and the gate of the amplification transistor.

With this configuration, the length of a wiring line which connects the FD and the gate of the amplification transistor (hereinafter FD wiring line) can be shortened. Accordingly, FD capacitance can be decreased. This effect is particularly great when the area of the photoelectric conversion element is large. Specifically, the effect is great when a pixel pitch is 10 μm or more.

Charge transferred to the FD is converted from charge to voltage by FD capacitance. When FD capacitance increases, charge-voltage conversion efficiency decreases. This results in greater noise in a circuit in the subsequent stage of the amplification transistor. More specifically, a decrease in charge-voltage conversion coefficient leads to degradation of pixel sensitivity. Qualitatively speaking, even if many signal charges exist, the voltage amplitude of a signal is small when the charges are converted to voltage. When pixel sensitivity is low, it is necessary to amplify a signal with high gain after the signal has been output from the circuit in the subsequent stage of the pixel or the image pickup device. At the same time, noise is amplified with high gain. When the noise amplified with high gain is random noise, it is difficult to increase a noise reduction rate in a noise reduction circuit. Thus, random noise components mainly increase. In contrast, according to the configuration of an embodiment of the present invention, an increase in FD capacitance can be suppressed, and as a result noise can be reduced.

Hereinafter, the present invention will be described using specific embodiments. In each embodiment, description will be given of a configuration in which signal charges are regarded as electrons and an N-type transistor is used as a transistor of a pixel. As a modification, signal charges may be regarded as electrons and a P-type transistor may be used as a transistor of a pixel. Alternatively, signal charges may be regarded as holes and an N-type transistor may be used as a transistor of a pixel. Signal charges may be regarded as holes and a P-type transistor may be used as a transistor of a pixel. Alternatively, a transistor of a pixel may have a CMOS configuration. These modifications can be realized by, for example, inverting the conductivity type of each semiconductor region or inverting the high/low relationship of voltage.

First Embodiment

Figure 2:
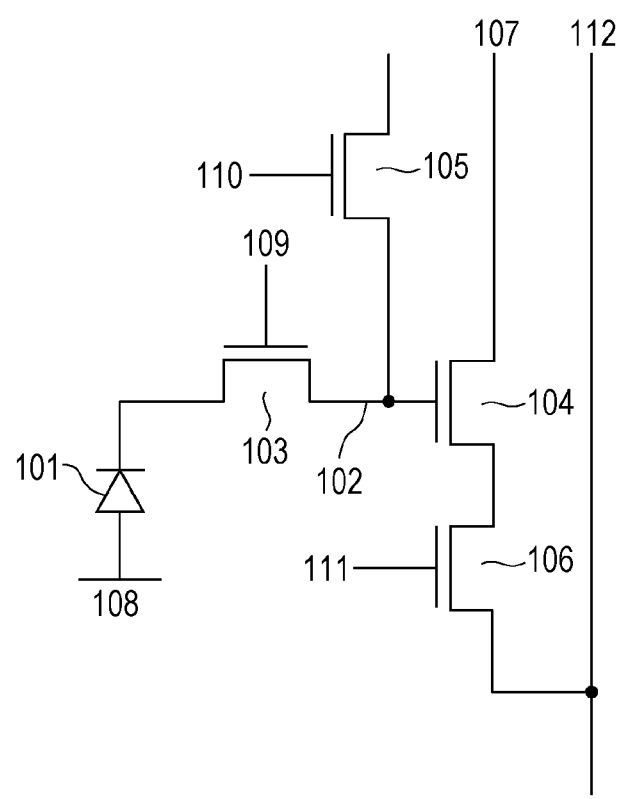
FIG. 2 is a diagram illustrating an equivalent circuit of a unit pixel according to the first embodiment.

FIG. 1 illustrates a planar structure of one pixel of an image pickup device according to a first embodiment. FIG. 2 illustrates an equivalent circuit of one pixel corresponding to the pixel structure. Elements having the same function are denoted by the same reference numerals.

In this embodiment, description will be given of a case where the present invention is applied to large-area pixels with a pixel pitch of 10 μm or more, specifically 50 μm. A pixel will be described with reference to FIGS. 1 and 2.

100 denotes a pixel. In an image pickup device, a region where a plurality of pixels 100 are arranged is a pixel region. The pixels 100 are arranged one-dimensionally or two-dimensionally. Preferably, the pixels are arranged two-dimensionally.

101 denotes an N-type semiconductor region (a first semiconductor region of a first conductivity type) constituting a photoelectric conversion element, 102 denotes a FD, 103 denotes a transfer gate that transfers charges in the N-type semiconductor region 101 to the FD, and 104 denotes an amplification transistor that amplifies a signal based on the charges transferred to the FD. A P-type semiconductor region (not illustrated) may be located above the N-type semiconductor region 101 to form an embedded-type photodiode. The amplification transistor 104 constitutes a source follower circuit together with a current source (not illustrated) that supplies bias current to the amplification transistor 104 via a vertical signal line 112 which will be described below.

A charge-voltage converting unit is constituted by the FD 102, the gate of the amplification transistor 104, a conductor that electrically connects them, and capacitance including the parasitic capacitance thereof. The gate of the amplification transistor 104 is connected to the FD 102 via the conductor. The conductor is a wiring line composed of a contact plug, a via plug, and metal. Aluminum, copper, or the like may be used as the material of the wiring line. Tungsten or the like may be used as the material of the plugs.

105 denotes a reset unit that supplies a certain voltage to the FD, and 106 denotes a selection unit that selects a pixel. For example, transistors may be used as the reset unit 105 and the selection unit 106. Also, a transistor may be used as the amplification transistor 104. Hereinafter, a case where N-type transistors are used as the reset unit 105, the selection unit 106, and the amplification transistor 104 will be described as an example.

The pixel according to this embodiment is constituted by these elements, but the present invention is not limited to this. For example, the selection unit 106 may not be provided, and the reset unit 105 may select a pixel by controlling the voltage supplied to the FD. Alternatively, any of the amplification transistor, the reset unit, and the selection unit, or a combination thereof, or all the three elements may be shared by a plurality of photoelectric conversion elements.

A first power supply wiring line 107 supplies a certain voltage to the drain of the reset transistor 105 and the drain of the amplification transistor 104. In this embodiment, the voltage supplied to the drain of the reset transistor 105 and the voltage supplied to the drain of the amplification transistor 104 are supplied through the same wiring line, that is, the first power supply wiring line 107. The voltage transmitted through the first power supply wiring line 107 is 5 V or 3.3 V, for example. The first power supply wiring line 107 supplies a voltage from a power supply circuit (not illustrated) to a pixel.

A second power supply wiring line 108 is a wiring line for supplying, for example, a ground potential. In a pixel, a ground potential is supplied to a common node of the photoelectric conversion element (P-type semiconductor region), and a P-type well in which transistors of the pixel are disposed.

A transfer control line 109 supplies drive pulses to the transfer gate 103, and a reset control line 110 supplies drive pulses to the gate of the reset transistor 105. A selection control line 111 supplies drive pulses to the gate of the selection transistor 106. These control lines transmit drive pulses from a vertical scanning circuit (not illustrated) to the transfer gate, the gate of the reset transistor 105, and the gate of the selection transistor 106.

The vertical signal line 112 reads out signals from pixels in units of pixel columns. Signals of a plurality of pixels controlled by the same selection control line 111 are read out by a plurality of vertical signal lines 112 almost simultaneously. A column circuit (not illustrated) is provided for each vertical signal line 112. The column circuit may include an amplification circuit that amplifies a signal transmitted through the vertical signal line 112, an AD conversion circuit that converts an analog signal transmitted through the vertical signal line 112 to a digital signal, a noise reduction circuit, and so forth.

The first and second power supply wiring lines 107 and 108, and a wiring line of each control line may have a two-layer structure which is mainly composed of aluminum. The cross-section of the wiring lines is substantially square, for example. The width of the wiring lines may be 0.6 μm, and the height of the wiring lines may be 0.6 μm.

The reset control line 110, the transfer control line 109, and the selection control line 111 extend in the direction along a pixel row. A wiring pattern in the direction along a pixel row is formed by, for example, using aluminum wiring lines in a first layer. As for the wiring in each pixel, aluminum wiring lines in a second layer are also used via a contact hole (not illustrated), for example.

The vertical signal line 112, the first power supply wiring line 107, and the second power supply wiring line 108 transmit signals of a plurality of pixels included in a certain pixel column, or supply voltage to individual elements or the like of the plurality of pixels included in the certain pixel column. Thus, the vertical signal line 112, the first power supply wiring line 107, and the second power supply wiring line 108 extend in the direction along a pixel column. Aluminum wiring lines in the second layer are used for a wiring pattern in the direction along a pixel column. As for the wiring in a pixel, aluminum wiring lines in the first layer are also used via a contact hole (not illustrated).

In this embodiment, the outer edge of the N-type semiconductor region 101 has a recessed portion 113 in plan view. The most part of the recessed portion 113 is a P-type semiconductor region. The amplification transistor 104, the reset transistor 105, and the selection transistor 106 are disposed in the recessed portion 113. Also, the FD and pixel transistors are disposed so that the length of a FD wiring line is as short as possible. Accordingly, FD capacitance can be decreased. As a result, charge-voltage conversion efficiency can be increased, and thereby noise can be reduced. In this embodiment, all the transistors constituting a pixel circuit are disposed in the recessed portion 113. However, at least one of the gate of the amplification transistor 104 and the source of the reset transistor 105 may be disposed therein. That is, at least one of portions that contribute much to FD capacitance may be disposed therein. Preferably, both of the amplification transistor 104 and the reset transistor 105 are disposed in the recessed portion 113. It is preferable that the other portions be disposed so as to minimize the area of the recessed portion 113.

In the case of an image pickup device including small-area pixels with a pixel pitch of several μm, the area of a pixel circuit portion is large with respect to the area of a light receiving portion of a photoelectric conversion element. As a result, an aperture ratio is less than 50% in most cases. Also, there is small difficulty in performing layout for realizing higher transfer efficiency using small-area pixels.

In contrast, as a result of applying this embodiment to large pixels with a pixel pitch of more than 10 μm, more preferably pixels with a pixel pitch of 20 μm or more, a problem of a decrease in sensitivity can be suppressed, and high transfer efficiency and reduced noise can be realized. The same applies to the following other embodiments.

Furthermore, in this embodiment, the FD 102 and the transfer gate 103 are surrounded by the N-type semiconductor region 101. The transfer gate 103 is so-called ring-shaped, and the FD 102 is located at the center thereof. In other words, a transfer channel is formed in the directions of 360 degrees when viewed from the FD 102. The outer edge of the transfer gate 103 is substantially hexagonal in plan view, and the FD 102 is located at the center thereof.

The ring shape of the transfer gate 103 enables signal charges dispersed from the individual directions of the N-type semiconductor region 101 to be transferred to the FD 102 without depending on the direction of the N-type semiconductor region 101 with respect to the FD 102. Furthermore, the gate width of the transfer gate 103 can be large, and thus transfer can be performed more reliably, and high transfer efficiency can be realized even in large-area pixels.

Figure 3:
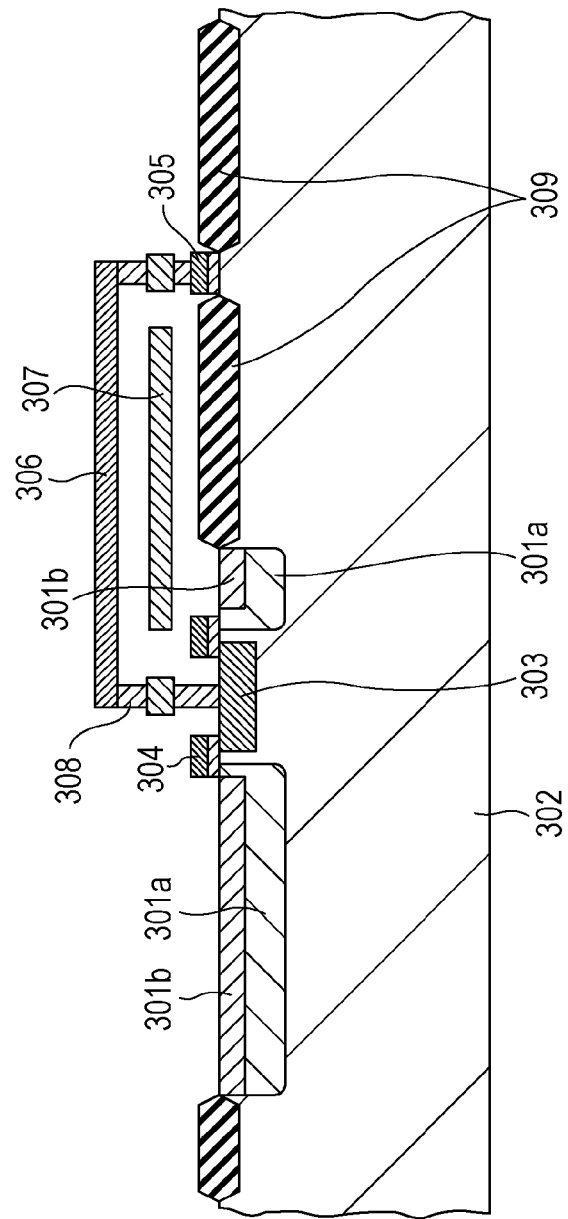
FIG. 3 is a diagram illustrating a cross section taken along line III-III of FIG. 1.

Next, a cross-sectional structure of this embodiment will be described with reference to FIG. 3. FIG. 3 is a cross-sectional view taken along line III-III of FIG. 1.

In FIG. 3, 301a denotes an N-type semiconductor region constituting a photoelectric conversion element, and 301b denotes a P-type semiconductor region located above the N-type semiconductor region 301a. 302 denotes a P-type well. The N-type semiconductor region 301a, the P-type semiconductor region 301b, and the P-type well 302 constitute an embedded-type photodiode.

303 denotes a FD, and 304 denotes a transfer gate electrode provided on a semiconductor substrate via a gate insulating film. The FD 303 is constituted by an N-type semiconductor region.

305 denotes a gate electrode of an amplification transistor, 306 denotes a FD wiring line, and 307 denotes a conductive pattern. 308 denotes a via plug. 309 denotes an element isolation region composed of an insulator. As the element isolation region 309, LOCOS (local oxidation of silicon), STI (Shallow trench isolation), or the like may be used.

The charge-voltage converting unit is constituted by including the FD 303, the FD wiring line 306, the contact plug, the gate electrode 305 of the amplification transistor, and the capacitance of them.

In this embodiment, the FD wiring line 306 is constituted by a second wiring layer or a wiring layer above the second wiring layer, and the conductive pattern 307, which is constituted by a wiring layer below the FD wiring line 306, is disposed at a position facing the FD wiring line 306. The FD wiring line 306 and the conductive pattern 307 face each other with an insulating film therebetween. Also, the conductive pattern 307 is connected to the source of the amplification transistor. The amplification transistor 104 performs a source follower operation, and thus the direction of a signal output from the source is the same as the direction of potential fluctuation that occurs in the FD 303. Also, the amplitude of the signal is almost the same though it depends on the gain of the source follower circuit. With this arrangement, the ratio of capacitance generated between the FD wiring line 306 and the conductive pattern 307 with respect to the wiring capacitance of the FD wiring line 306 can be increased. Also, since the direction of change in the potential of the conductive pattern 307 is the same as the direction of change in the potential of the FD wiring line 306, the parasitic capacitance between the conductive pattern 307 and the FD wiring line 306 can be ignored, and substantial wiring capacitance can be decreased. In a case where the conductive pattern 307 is not provided, the FD wiring line 306 faces the semiconductor substrate via the insulator, and the capacitance generated between the FD wiring line 306 and the semiconductor substrate or individual semiconductor regions in the semiconductor substrate cannot be ignored. The portion of the semiconductor substrate that faces the FD wiring line 306 does not necessarily match the direction of change in the potential of the FD wiring line 306, and thus wiring capacitance is generated. Therefore, noise can be further reduced by disposing the conductive pattern 307 to decrease FD capacitance.

Next, a method for manufacturing an image pickup device according to this embodiment will be described. A feature of the method for manufacturing an image pickup device according to this embodiment is a method for forming the N-type semiconductor region 301a located below the ring-shaped transfer gate 304. The element isolation region 309 and the P-type well 302 are formed by using a known method. Then, the transfer gate electrode 304 and the gate electrode 305 of the amplification transistor are formed. After that, with a region other than the region for the photoelectric conversion element, such as the region for the FD 303, being masked, ion implantation with an N-type ion is performed on the transfer gate electrode 304 using self-alignment. At this time, ion implantation is performed by using a rotation ion implantation method in which tilt is given to the surface of a semiconductor substrate and a wafer is rotated with respect to a normal. With this method, the N-type semiconductor region 301a can be extended to a certain position just below the transfer gate electrode 304 in all the directions surrounding the FD 303. An appropriate tilt angle θ for ion implantation is 10 to 40 degrees.

In this embodiment, the outer edge of the transfer gate electrode 103 is formed in a hexagonal shape in plan view, but the shape is not limited thereto.

Figure 4:
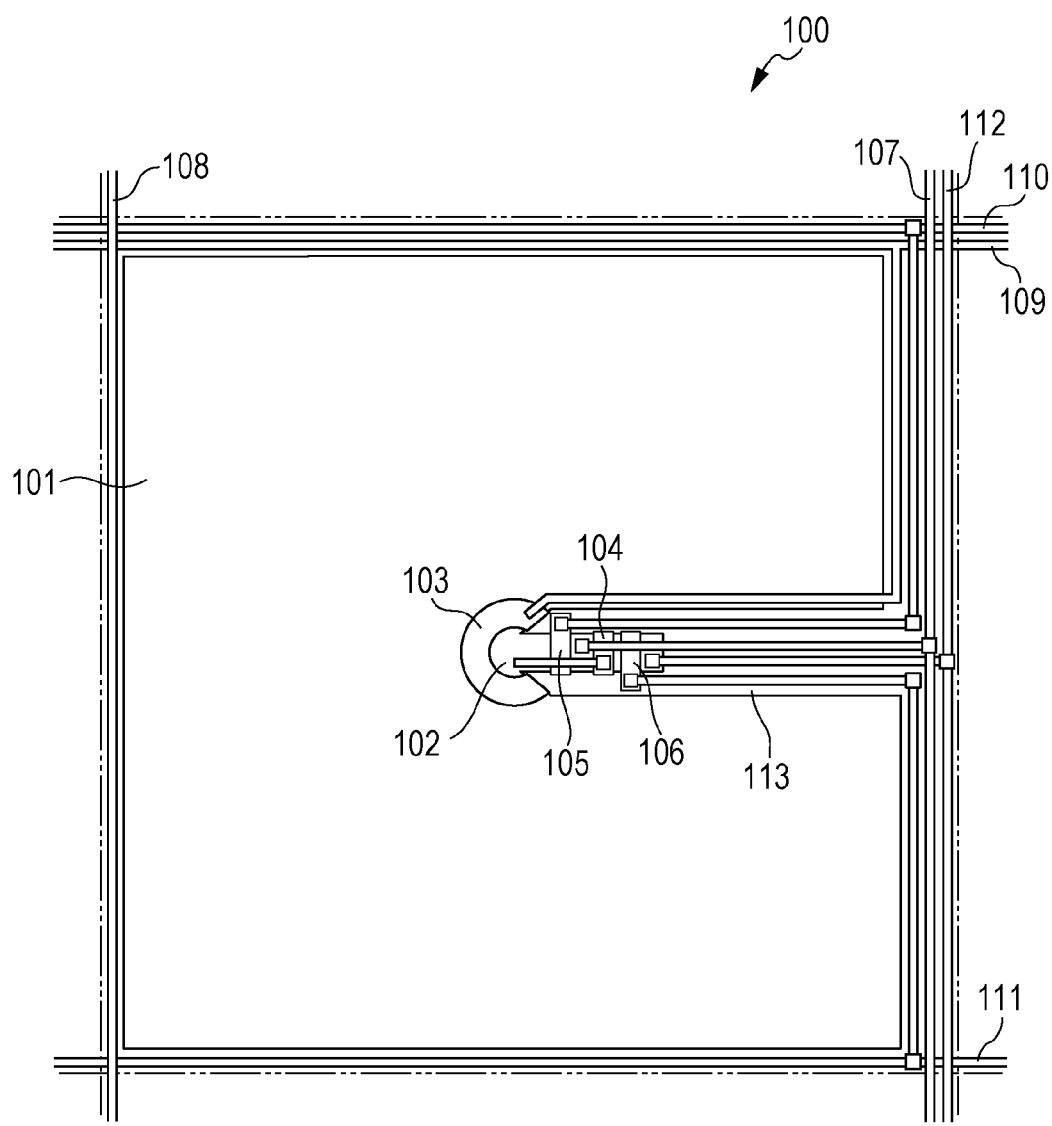
FIG. 4 is a diagram illustrating a modification of the first embodiment.

FIG. 4 illustrates a modification of this embodiment. The elements having the same function as those in FIG. 1 are denoted by the same reference numerals, and the detailed description thereof is omitted. In FIG. 4, the planar shape of the transfer gate electrode 403 is a shape having curvature. However, the shape is not a perfect ring shape, and the FD 102 and the source region of the reset transistor 105 are disposed in the same active region. In other words, the FD 102, the amplification transistor 104, and the reset transistor 105 are disposed in the recessed potion 113. With this configuration, the area of the recessed portion 113 can be decreased.

Furthermore, the source and drain regions of the amplification transistor 104 and the selection transistor 106 may be disposed in the same active region where the FD 102 is located. That is, an element isolation region composed of an insulator is not provided between the FD 102 and the source of the selection transistor. Such a configuration is preferable because the reset transistor 105, the amplification transistor 104, and the selection transistor 106 can be linearly disposed, and the area of the recessed portion 113 can be decreased.

According to this embodiment and the modification thereof, the transfer efficiency from the photoelectric conversion element to the FD can be increased while suppressing an increase in FD capacitance, even in large-area pixels with a pixel pitch of 20 μm or more.

Second Embodiment

Figure 5:
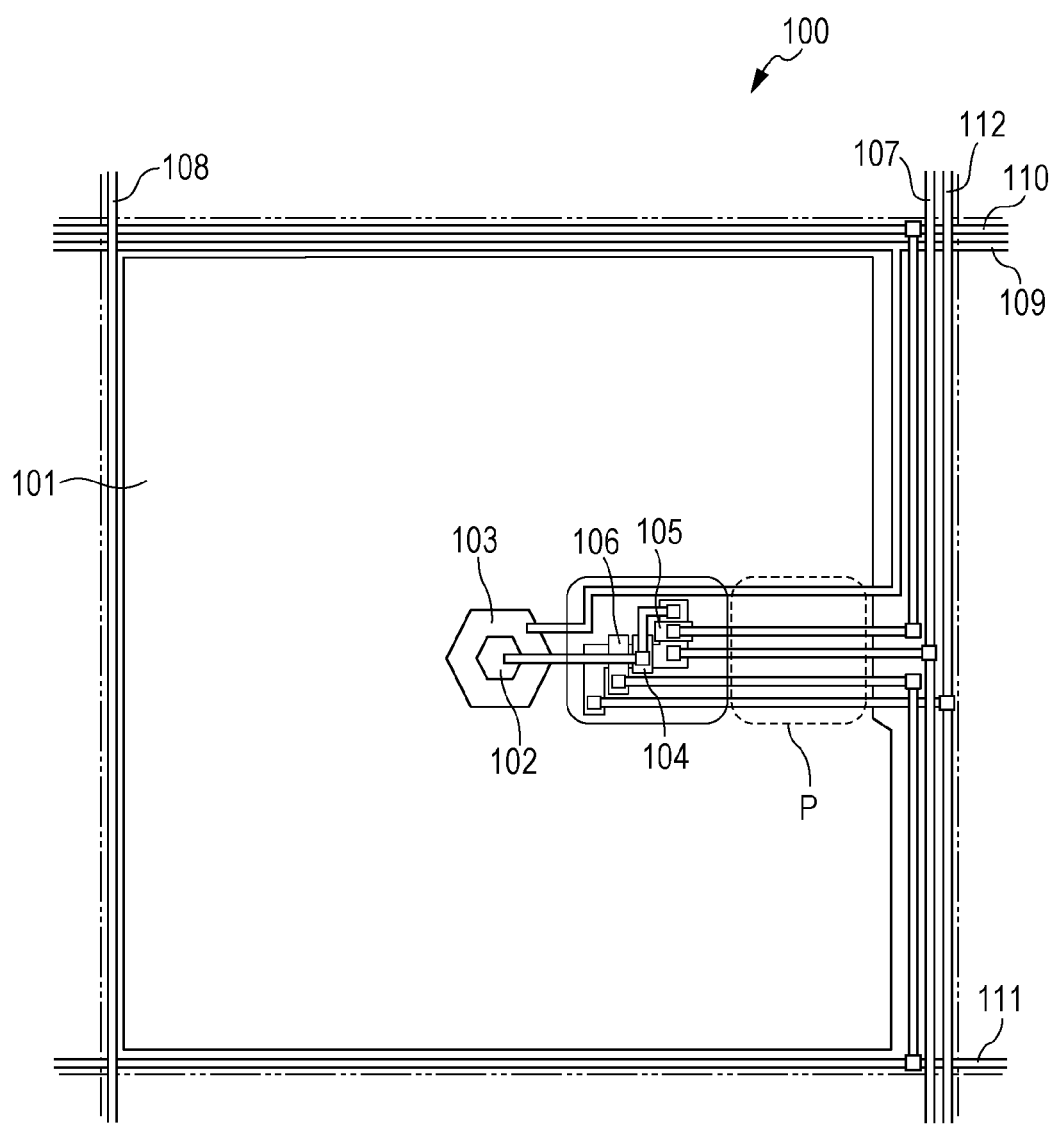
FIG. 5 is a diagram illustrating a pixel structure of an image pickup device according to a second embodiment.

FIG. 5 illustrates a planar structure of one pixel of an image pickup device according to a second embodiment. The same elements as those in the first embodiment are denoted by the same reference numerals, and the detailed description thereof is omitted. An equivalent circuit of one pixel corresponding to this pixel structure is the same as that in the first embodiment. The pixel pitch of the image pickup device according to this embodiment is 20 μm or more, specifically 50 μm. This embodiment is different from the first embodiment in that an N-type semiconductor region constituting a photoelectric conversion element surrounds a FD, a transfer gate, and the gate of an amplification transistor. The surrounding N-type semiconductor region is a region constituting a photoelectric conversion element of one pixel. With this configuration, in addition to the effect obtained in the first embodiment, the area of the N-type semiconductor region 101 constituting a photoelectric conversion element can be increased. Also, in addition to the effect of the first embodiment, the sensitivity can be further increased. Also, saturation in the photoelectric conversion element can be enhanced.

In this embodiment, the source and drain regions of the transistors constituting a pixel circuit are disposed so as to be completely surrounded by the N-type semiconductor region 101 which constitutes a photoelectric conversion element. Accordingly, wiring lines for connecting the transistors of the pixel to the power supply wiring line and the vertical signal line are disposed in the N-type semiconductor region 101. In the photoelectric conversion element, a region where wiring lines are disposed is insensitive with respect to light. However, a region between wiring lines can be used as a photoelectric conversion region.

In many cases, it is difficult to transfer signal charges generated in a region P defined by a broken line in FIG. 5 to the FD 102 by using the transfer gate electrode 103. A potential gradient (not illustrated) may be formed in the region P, and signal charges generated in the region P may be first moved to the region outside thereof via an internal electric field. Specifically, the N-type impurity concentration of the region P as NET concentration may be lower than that of the region outside thereof.

An aperture ratio of a photoelectric conversion element is determined by the relationship between the area of an insensitive region, which is a region where a pixel circuit is disposed, and the area of the photoelectric conversion element. Thus, design is performed to obtain an optimum aperture ratio. As for an insensitive region where wiring lines are disposed on the photoelectric conversion element, a substantial insensitive region can be decreased by using a microlens.

According to this embodiment, transfer efficiency can be increased while suppressing an increase in FD capacitance, even in large-area pixels with a pixel pitch of 20 μm or more. Also, the maximum distance from a signal charge generating portion in a photoelectric conversion element to the transfer gate electrode 103 can be shortened. Accordingly, an image pickup device that achieves both reduction of signal charges not transferred and higher transfer efficiency can be obtained.

Third Embodiment

Figure 6:
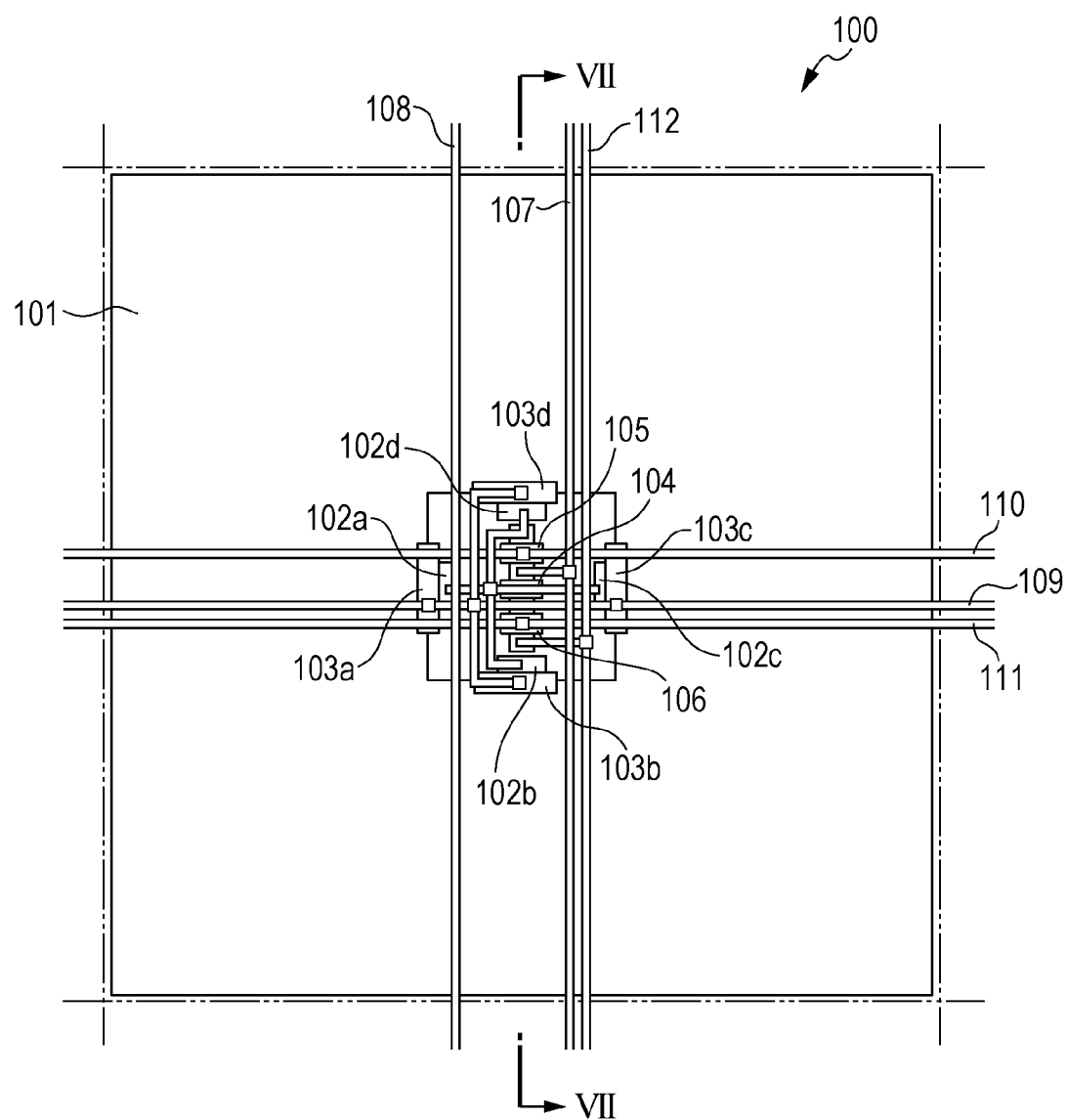
FIG. 6 is a diagram illustrating a pixel structure of an image pickup device according to a third embodiment.

FIG. 6 illustrates a planar structure of one pixel of an image pickup device according to a third embodiment. The same elements as those in the first embodiment are denoted by the same reference numerals, and the detailed description thereof is omitted. An equivalent circuit of this embodiment is the same as that in the first embodiment. This embodiment is applied to large-area pixels with a pixel pitch of 20 μm or more, specifically 50 μm.

In this embodiment, one photoelectric conversion element includes a plurality of FDs 102 and a plurality of transfer gate electrodes 103. In this embodiment, one photoelectric conversion element includes four FDs 102 and four transfer gate electrodes 103, that is, a transfer gate electrode 103a that transfers charges to a first FD 102a, a transfer gate electrode 103b that transfers charges to a first FD 102b, a transfer gate electrode 103c that transfers charges to a first FD 102c, and a transfer gate electrode 103d that transfers charges to a first FD 102d. The FDs 102a to 102d and the transfer gate electrodes 103a to 103d are disposed at the center of the photoelectric conversion element. The outer edges of the individual transfer gate electrodes 103a to 103d are rectangular in plan view. Furthermore, the N-type semiconductor region constituting the photoelectric conversion element surrounds the P-type semiconductor region including a semiconductor region constituting the source and drain regions of the amplification transistor 104, the reset transistor 105, and the selection transistor 106. The reset transistor 105 discharges charges of the plurality of FDs 102a to 102d. The FDs 102a to 102d are located in active regions independent of one another. The amplification transistor 104, the reset transistor 105, and the selection transistor 106 are disposed in the same active region which is different from the active regions where the individual FDs 102a to 102d are located.

As a result of disposing the plurality of transfer gate electrodes at the center of the photoelectric conversion element, the transfer efficiency of signal charges generated in a light incident surface of the photoelectric conversion element can be increased. Furthermore, the transfer gate electrode width can be increased, and thus transfer can be performed more reliably, and high transfer efficiency can be realized even in large-area pixels.

It is preferable that the FDs 102a to 102d be located in different active regions. This is because, if the FDs 102a to 102d are located in the same active region, it becomes difficult to acquire a space for disposing pixel transistors.

Furthermore, according to the configuration of this embodiment, FD wiring lines for connecting the FDs 102 and the gate electrode of the amplification transistor 104 disposed at the center of the photoelectric conversion element can be shortened, and thus FD capacitance can be decreased. Also, wiring lines for connecting the FDs 102 and the source of the reset transistor 105 can be shortened, and thus FD capacitance can be decreased.

In this embodiment, the active region where the source and drain regions of the transistors constituting a pixel circuit are located is completely surrounded by the N-type semiconductor region constituting the photoelectric conversion element, and thus wiring lines in a pixel are disposed on the photoelectric conversion element. The wiring region is insensitive with respect to light, but a region between wiring lines can be used as a photoelectric conversion region. As for the insensitive region, a substantial insensitive region can be decreased by using a microlens.

This embodiment increases the degree of freedom in layout of wiring lines, and is thus preferable particularly when a pixel pitch is larger.

Figure 7:
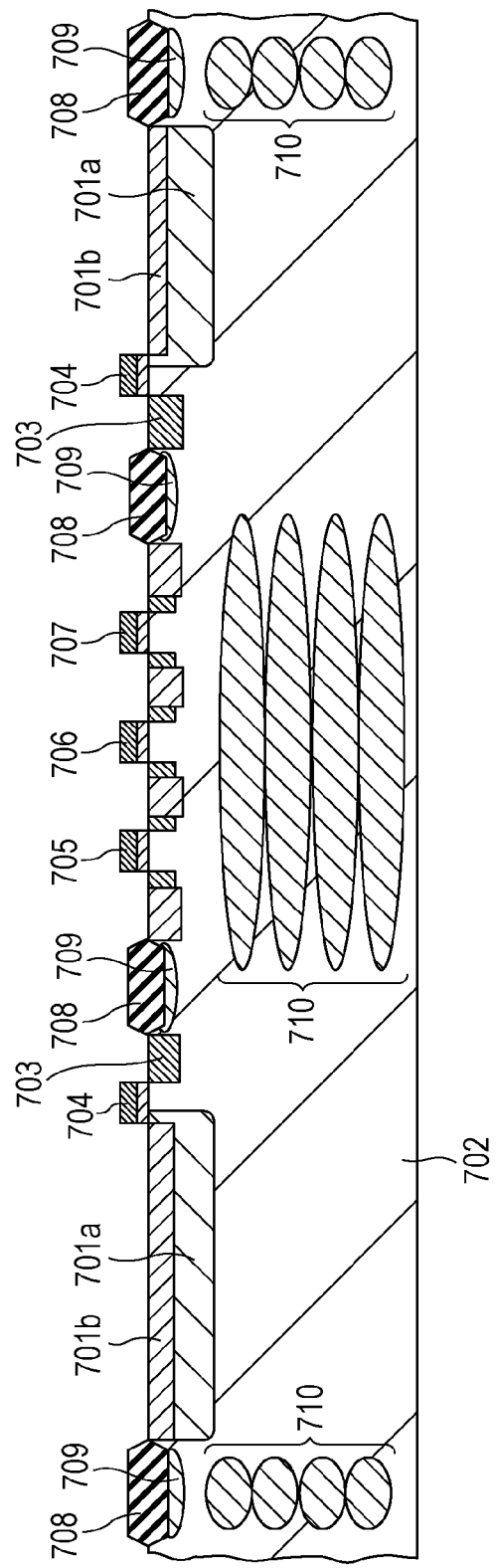
FIG. 7 is a diagram illustrating a cross section of the image pickup device according to the third embodiment.

FIG. 7 illustrates a cross-sectional view taken along line VII-VII of FIG. 6. Here, a portion from the bottom to a polysilicon electrode is illustrated, and illustration of wiring lines in the layers above the polysilicon is omitted.

An N-type semiconductor region 701a, a P-type semiconductor region 701b located on a front surface of the N-type semiconductor region 701a, and a P-type semiconductor region 702 constitute a photoelectric conversion element. Here, the photoelectric conversion element is a so-called embedded-type photodiode.

An N-type semiconductor region 703 constitutes a FD. A transfer gate electrode 704 transfers electrons in the N-type semiconductor region 701a to the N-type semiconductor region 703. A reset transistor 705, an amplification transistor 706, and a selection transistor 707 constitute pixel transistors. All of them are N-type transistors. The P-type semiconductor region 702 extends in a lower portion of these pixel transistors. Alternatively, a P-type semiconductor region formed in a different step may be located therein. The region where the pixel transistors are disposed is surrounded by the N-type semiconductor region 701a, and the most part of the region is a P-type semiconductor region.

An insulating isolation region 708 is located between photoelectric conversion elements adjacent to each other, or between a photoelectric conversion element and an active region where pixel transistors are disposed. A P-type semiconductor region 709 is a channel stop region. A P-type semiconductor region 710 is a potential barrier disposed between photoelectric conversion elements adjacent to each other or between a photoelectric conversion element and pixel transistors. The P-type semiconductor region 710 may extend to a portion below the pixel transistors, or may be located only below the insulating isolation region 708. The P-type semiconductor region 710 which is located between photoelectric conversion elements adjacent to each other suppresses inflow of electrons mainly from the adjacent photoelectric conversion elements. Also, the P-type semiconductor region 710 which is located between a photoelectric conversion element and pixel transistors is capable of suppressing the amount of electrons discharged mainly to the source and drain regions of the pixel transistors. The P-type semiconductor region 710 may be located only between photoelectric conversion elements. Also, the P-type semiconductor region 710 may be located to be continuous with the P-type semiconductor region 709. Also, in this embodiment, the P-type semiconductor regions 709 and 710 may not be provided, as illustrated in FIG. 3. On the other hand, the P-type semiconductor regions 709 and 710 according to this embodiment may be provided for the configuration illustrated in FIG. 3.

Example of Application to Image Pickup System

Figure 8:
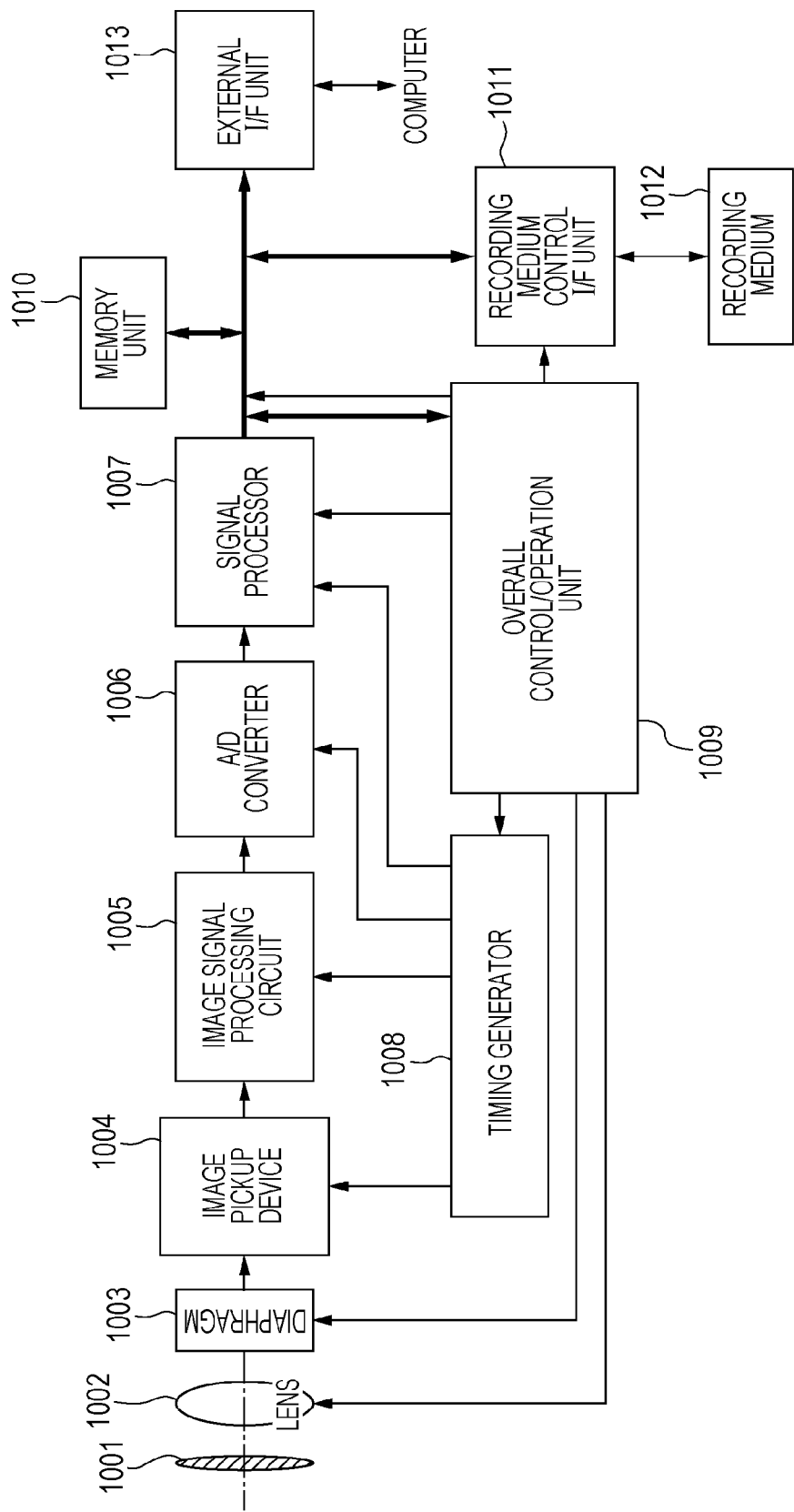
FIG. 8 is a block diagram illustrating an example of an image pickup system.

FIG. 8 illustrates an example of a circuit block in a case where the image pickup device according to an embodiment of the present invention is applied to a camera. A shutter 1001 is disposed in front of an image taking lens 1002, so as to control exposure. The amount of light is controlled by a diaphragm 1003 when it is necessary, and thereby an image is formed by an image pickup device 1004. These elements constitute an optical system. A signal output from the image pickup device 1004 is processed by a signal processing circuit 1005, and is converted by an A/D converter 1006 from an analog signal to a digital signal. The digital signal which is output is further processed by a signal processor 1007. The processed digital signal is stored in a memory 1010, or is transmitted to an external apparatus via an external I/F 1013. The image pickup device 1004, the image signal processing circuit 1005, the A/D converter 1006, and the signal processor 1007 are controlled by a timing generator 1008, whereas the entire system is controlled by an overall control/operation unit 1009. In order to record an image on a recording medium 1012, the output digital signal is recorded via a recording medium control I/F unit 1011 which is controlled by the overall control/operation unit.

The present invention has been described in detail with reference to the embodiments. Regarding image pickup devices for which high sensitivity is demanded, an increase in pixel size is under consideration, contrary to a decrease in pixel size. For example, in the case of a highly sensitive full HD (1920×1080 pixels) sensor of a 35 mm film size, the pixel pitch is about 20 µm if design is performed to make best use of an image circle of a lens. In the case of an image pickup device for medical use, a pitch in the range from 50 μm to 200 μm may be demanded as a preferable pixel pitch. In view of this, the image pickup device according to an embodiment of the present invention is particularly effective when it is applied to a device having a pixel pitch, which is a distance between a plurality of pixels, of equal to or larger than 20 μm and equal to or smaller than 200 μm.

According to an embodiment of the present invention, an increase in floating diffusion capacitance can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2011/080252, filed Dec. 27, 2011, which is hereby incorporated by reference herein in its entirety.

The invention claimed is:

1. An image pickup device in which a plurality of pixels are arranged in a semiconductor substrate, each of the plurality of pixels comprising:
 a photoelectric conversion element including a first semiconductor region of a first conductivity type and a second semiconductor region of a second conductivity type, the second semiconductor region constituting a PN junction together with the first semiconductor region;
 a floating diffusion region of the first conductivity type;
 a transfer gate that transfers charges in the first semiconductor region to the floating diffusion region; and
 an amplification transistor whose gate is electrically connected to the floating diffusion region,
 wherein an outer edge of the first semiconductor region has a recessed portion in plan view,
 wherein the gate of the amplification transistor is disposed in the recessed portion and is surrounded by the first semiconductor region in at least two directions in plan view, and
 wherein the floating diffusion region is surrounded by the first semiconductor region or is located in the recessed portion in plan view.

2. The image pickup device according to claim 1, wherein an element isolation region composed of an insulator is located at a boundary between the first semiconductor region and the recessed portion.

3. The image pickup device according to claim 1, wherein the transfer gate is ring-shaped, and the floating diffusion region is located in a region surrounded by the transfer gate.

4. The image pickup device according to claim 1, comprising a wiring line that electrically connects the floating diffusion region and the gate electrode of the amplification transistor, wherein a conductive pattern that is electrically connected to a source of the amplification transistor is disposed between the wiring line and the semiconductor substrate.

5. The image pickup device according to claim 1, wherein a third semiconductor region of the second conductivity type is located in the recessed portion, and a source region and a drain region of the amplification transistor are located in the third semiconductor region.

6. The image pickup device according to claim 1, comprising a reset transistor that discharges charges in the floating diffusion region, wherein the reset transistor is disposed in the recessed portion.

7. The image pickup device according to claim 6, wherein the floating diffusion region, the source region and the drain region of the amplification transistor, and a source region and a drain region of the reset transistor are located in the same active region.

8. The image pickup device according to claim 1, wherein the second semiconductor region extends in the recessed portion, and a semiconductor region of the second conductivity type is located below the extended second semiconductor region.

9. The image pickup device according to claim 1, wherein a pixel pitch P, which is a distance between the plurality of pixels, is equal to or larger than 20 μm and is equal to or smaller than 200 μm.

10. An image pickup system comprising the image pickup device according to claim 1, an optical system that optically forms an image on the image pickup device, and a signal processing circuit that processes a signal from the image pickup device.

* * * * *